United States Patent [19]

Franke

[11] 4,063,168

[45] Dec. 13, 1977

[54] METHOD AND APPARATUS FOR LOCATING THE SOURCE OF CORONA DISCHARGE

[75] Inventor: Earnest Allen Franke, Howell Township, Monmouth County, N.J.

[73] Assignee: Bell Telephone Laboratories, Incorporated, Murray Hill, N.J.

[21] Appl. No.: 630,073

[22] Filed: Nov. 7, 1975

[51] Int. Cl.² ............................................ G01R 31/02
[52] U.S. Cl. .................................. 324/72; 324/123 R
[58] Field of Search .................. 324/54, 126, 133, 72, 324/123

[56] References Cited

U.S. PATENT DOCUMENTS

| | | | |
|---|---|---|---|
| 3,295,022 | 12/1966 | Schelisch | 324/72 |
| 3,505,597 | 4/1970 | Cronin et al. | 324/72 |
| 3,781,680 | 12/1973 | Stehlin | 324/123 R |
| 3,869,665 | 3/1975 | Kenmochi | 324/72 |

*Primary Examiner*—M. Tokar
*Attorney, Agent, or Firm*—Stephen M. Gurey

[57] ABSTRACT

It has been determined that unique discharge signature waveform shapes are associated with the corona discharges in the components of the power separation filters of repeaters and equalizers. These signature waveform shapes, present across the repeater or equalizer terminals, can be measured and identified by artificially contaminating and inducing corona discharges in the high voltage components. A discharge signal subsequently generated in response to a corona discharge across a high voltage component of a repeater or equalizer of a similar type will have the same shape as one of the signature waveforms. Thus, a corona discharge from a repeater or equalizer under test can be located by comparing its discharge signal with the catalog of signature waveforms. In the embodiment of the invention disclosed herein, the relationship between the spectral energies of the discharge signal at two predetermined frequencies is compared with the relationship between the spectral energies of the signature waveforms at these same frequencies. From such a comparison, the shape of the frequency spectrum of the discharge signal can be determined and thus the signature waveform it most closely approximates. The source of the corona discharge is thence readily identifiable.

7 Claims, 4 Drawing Figures

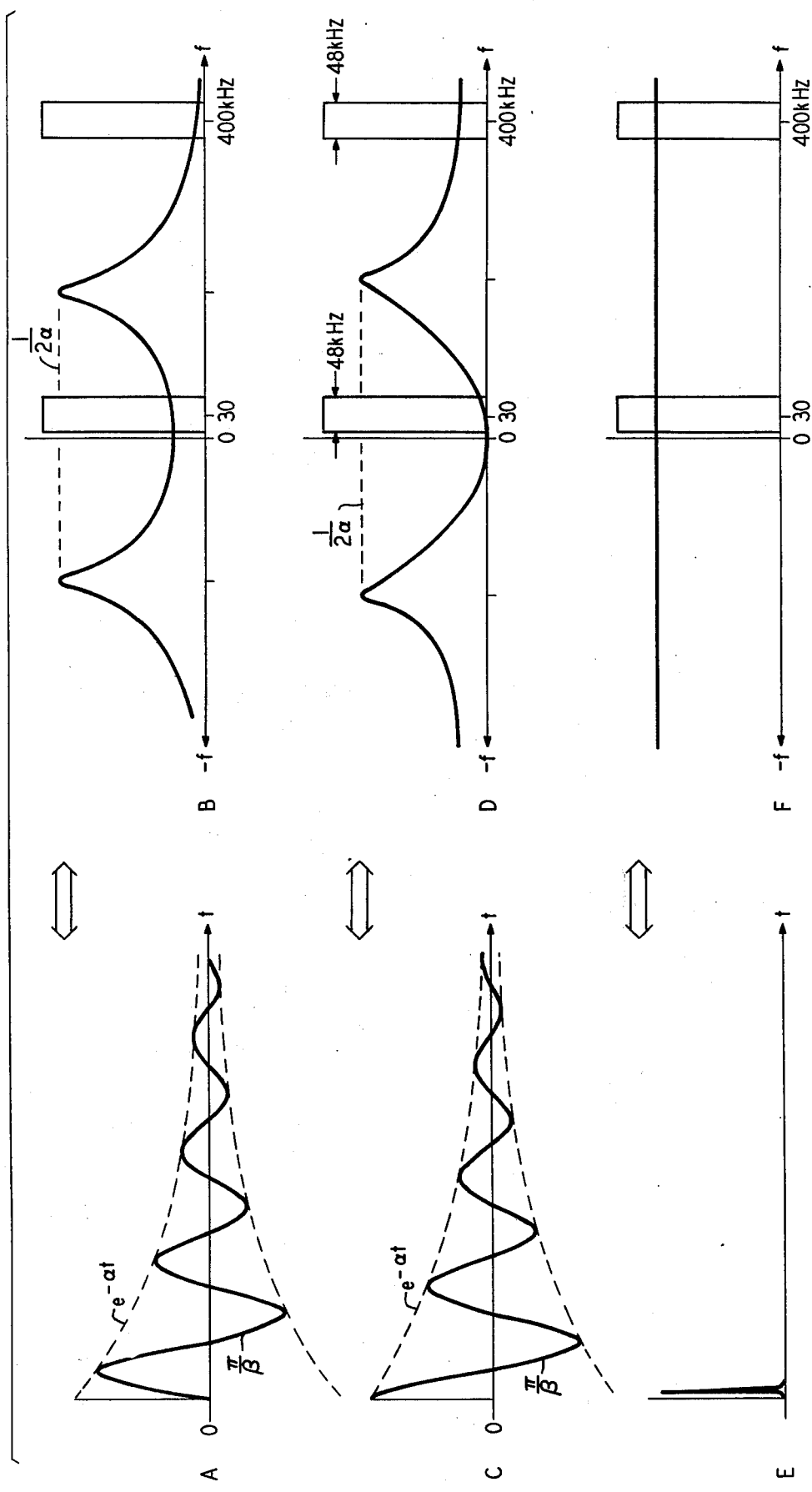

METHOD AND APPARATUS FOR LOCATING THE SOURCE OF CORONA DISCHARGE

BACKGROUND OF THE INVENTION

This invention relates to the identification of the source of a corona discharge in apparatus under test.

Underwater repeatered telephone cable systems are series powered by high voltage dc power supplies established at the shore terminals. Each repeater and equalizer that is utilized in such a system contains a power separator filter for extracting the dc current from the center conductor of the coaxial cable while allowing signal transmission. Corona discharges which can interrupt signal transmission can occur across the dielectrics of the high voltage filter capacitors within the underwater repeaters and equalizers. These discharges are often the result of a contamination on the capacitor insulating container or within the capacitor dielectric. Since underwater repeaters and equalizers are difficult to service once installed, it is desirable to identify a faulty repeater or equalizer before it is put into service. Furthermore, it is desirable to identify, with certainty, the particular faulty component(s) which is likely to cause corona discharge within a repeater or equalizer so it may be either repaired or replaced. Repeaters and equalizers are thus corona discharge tested before being placed into service. Prior art corona discharge testers, however, could only identify that a particular repeater or equalizer under test was subject to corona discharges and were not capable of identifying the particular faulty component within. Therefore, once a repeater or equalizer was determined to be faulty, the entire network had to be laboriously examined to find the discharge producing component.

SUMMARY OF THE INVENTION

It is an object of the present invention to identify the source of a corona discharge within a repeater or equalizer under test.

In accordance with the present invention, a unique discharge signal waveform shape, observable across the coaxial terminals of a repeater or equalizer, can be associated with the corona discharge of each high voltage component within the repeater or equalizer. These signature discharge waveform shapes are determined by artificially inducing a corona discharge across each high voltage component and then examining the resultant signal at the coaxial terminals. Once the signature waveform shapes are determined for a particular type of repeater or equalizer, all repeaters or equalizers of that type can be corona discharge tested since the discharge signal of the repeater or equalizer under test will have the same shape as one of the signature waveforms. Accordingly, the source of a corona discharge can be determined by associating its discharge signal with a particular signature waveform.

Since the frequency spectrums of the signature waveforms are also uniquely identifiable, the source of a corona discharge can be determined by identifying the shape of the frequency spectrum of the discharge signal with the shape of the frequency spectrum of one of the signature waveforms. In an embodiment of the invention disclosed herein, the relationship between the spectral energies of a discharge signal at two predetermined frequencies is compared with the relationship between the spectral energies of the signature waveforms at the same predetermined frequencies. From such a comparison the shape of the frequency spectrum of the discharge signal can be determined. Thus the source of the corona discharge within the repeater or equalizer under test can be unambiguously located.

It is a feature of the present invention that the high voltage components within a repeater or equalizer which are particularly subject to corona discharges can be automatically identified during a testing period.

It is an additional feature of the present invention that the severity of the corona discharges within a repeater or equalizer under test can be determined.

BRIEF DESCRIPTION OF THE DRAWINGS

FIG. 2 illustrates several discharge signal waveforms observable at the coaxial cable terminals of the repeater of FIG. 1 and their corresponding frequency spectrum shapes;

DETAILED DESCRIPTION

In accordance with the present invention faulty components subject to corona discharges within the power separation filters of submarine cable repeaters and equalizers are identified. The term corona discharge is understood to include all types of discharges across a portion of a dielectric. These discharges include internal cavity discharges, surface discharges on the walls of an insulator, and discharges from sharp conductor points. The present invention is capable of detecting any of these discharges. As will be described, repeaters and equalizers are factory tested by applying a high dc voltage to the unit under test. Any resultant corona discharges emanating from the high voltage components are detected and identified by the discharge detector of the present invention. By examining the shape of the corona discharge signals, the discharge detector identifies the particular component(s) within the power separation filter causing discharge. Accordingly, the particular defective component(s) within the repeater or equalizer which is subject to corona discharge can either be repaired or replaced before the repeater or equalizer is put into undersea service. Thus, by localizing the source of corona discharges to the particular faulty components within the repeaters or equalizers great time and expense can be saved in the preparation of the undersea units for service. Whereas, prior art corona discharge detectors could only determine that a repeater or equalizer was subject to corona discharge, the particular faulty component causing the discharge not being identified. Thus, all the high voltage components which could possibly be subject to corona discharges had to be examined or replaced prior to service.

In an article entitled "Corona Considerations in Submarine Cable Communication Systems", *IEEE Transactions on Electrical Insulation,* Vol. EI-9, Dec. 1974, pp 150–154, the applicant describes the identification of the unique signature waveform shapes associated with the corona discharges of the high voltage components within a submarine repeater or equalizer. As described in detail therein, the corona discharges were induced across the high voltage components by applying a thin film of a contaminant spray across each dielectric and observing, on an oscilloscope, the resultant discharge signals at the coaxial cable terminals of the repeater or equalizer. From such selective inducement of corona discharges, the resultant signal waveforms at the coaxial cable terminals have been mathematically modeled and uniquely associated with particular high voltage components within the power separation filter of the repeater or equalizer under test.

Figure 1:
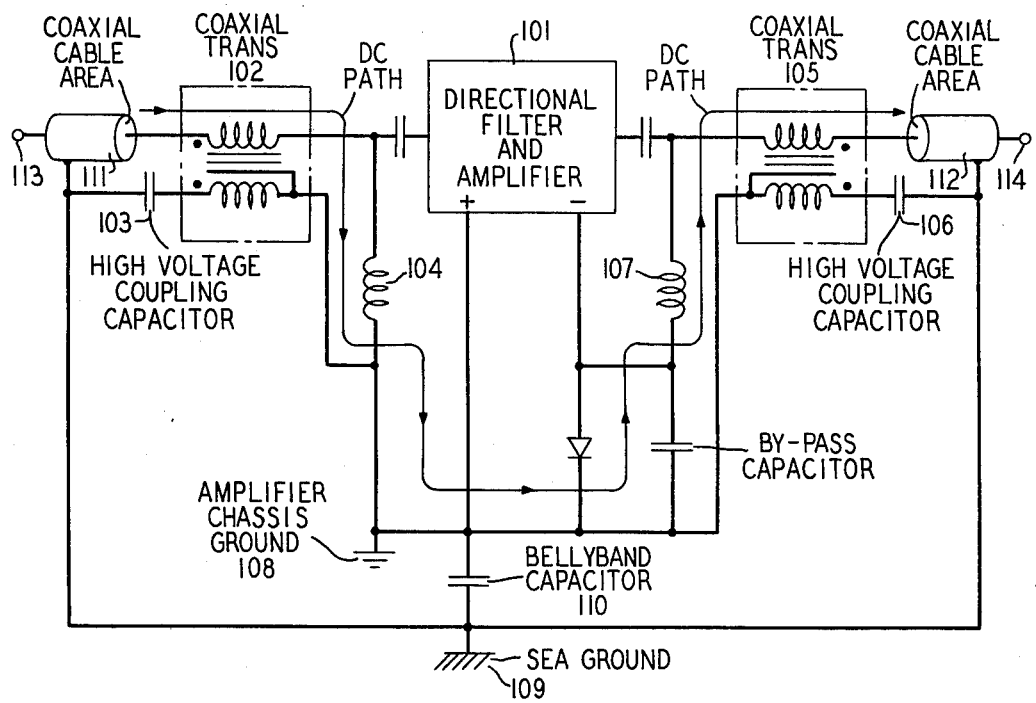
FIG. 1 is a schematic block diagram of a typical repeater employed in an underwater telephone cable system.

FIG. 1 illustrates an undersea repeater unit. The directional filter and amplifier 101 of the repeater unit derives its power by dropping a portion of the high voltage supplied from shore terminals on the center conductor of the coaxial cable. Accordingly, an input power separation filter consisting of coaxial transformer 102, high voltage couping capacitor 103, and inductor 104, extracts the dc current from the center conductor of the coaxial cable while allowing signal transmission through the directional filter and amplifier 101. Similarly, an output power separation unit consisting of coaxial transformer 105, high voltage coupling capacitor 106, and inductor 107 reinserts the dc current into the signal path. As can be noted in FIG. 1, a high voltage is present between amplifier chassis ground 108 and the sea ground 109 of the coaxial cable braid and high-pressure housing of the repeater. The bellyband capacitor 110, a cylindrical epoxy capacitor surrounding the amplifier chassis, provides a low impedance between grounds. The signal voltage at lower frequencies is handled by the larger capacitance, high-voltage coupling capacitors 103 and 106. Bellyband capacitor 110 and the high voltage coupling capacitors 103 and 106 are potential sources of corona discharges. In addition, the coaxial cable input and output areas 111 and 112, which consist of the high-pressure seals, the pigtail braid leads, and the splices, are subject to corona discharges.

As described in the aforenoted article, high voltage discharges across the dielectric face of either the bellyband capacitor 110 or the high voltage coupling capacitors (103, 104) will produce ringing voltages at the cable sides of power separation filters at terminals 113 and 114. The shape of the discharge signal present at either terminal 113 or 114 due to a corona discharge of bellyband capacitor 110 can be approximated by:

$$x(t) = e^{-\alpha t}\sin \beta t \qquad (1)$$

where $\alpha$ is a damping factor determined by the reflective resistance in the LC circuit formed by the bellyband capacitor, the high voltage capacitor, the windings in the coaxial transformers, and $\beta$ is the resonant frequency similarly determined from the same network components.

The frequency spectrum of the bellyband capacitor corona discharge is given by:

$$X(\omega) = \frac{\beta}{(\alpha^2 + \beta^2) - \omega^2 + j2\alpha\omega} \qquad (2)$$

The shape of the discharge signal at terminal 113 due to a corona discharge of coupling capacitor 103, and the shape of the discharge signal at terminal 114 due to a corona discharge of coupling capacitor 106 can be approximated to be:

$$x(t) \simeq e^{-\alpha t}[\cos \beta t - (\alpha/\beta)\sin \beta t] \qquad (3)$$

with a frequency spectrum given by:

$$X(\omega) = \frac{j\omega}{(\alpha^2 + \beta^2) - \omega^2 + j2\alpha\omega}. \qquad (4)$$

The discharge signals present at the coaxial cable terminals of a power separation filter due to a corona discharge in the cable area is measurable as a rectangular pulse shape, of width $\tau$, equivalent to a discharge in a void of a simple dielectric. The spectrum is given by:

$$X(f) = \tau\left[\frac{\sin(\pi f\tau)}{\pi f\tau}\right]. \qquad (5)$$

FIG. 2 illustrates, for each type of corona discharge, the discharge signature waveform shape observable at the coaxial cable terminal and the corresponding frequency spectrum. By using component values typically used in submarine cable systems for the bellyband capacitor (3300 picofarads) and the coupling capacitors (0.013 microfarads), the resonant frequency $\beta$ of a submarine repeater network has been measured to be 180 kHz. Additionally, from the repeater network configuration of FIG. 1 the damping factor $\alpha$ can be determined. FIG. 2, part A, illustrates the discharge signature waveform shape observable at the coaxial cable terminal of a repeater or equalizer under test in response to a corona discharge of a bellyband capacitor. FIG. 2, part B, illustrates the shape of its corresponding frequency spectrum. FIG. 2, part C, illustrates the discharge signal waveform shape observable at the coaxial cable terminal in response to the corona discharge of a high voltage coupling capacitor. FIG. 2, part D, illustrates the shape of its corresponding frequency spectrum. The signal observable at the coaxial cable terminals due to a corona discharge in the coaxial cable area is a rectangular pulse of a width typically between 10 and 50 nanoseconds. This discharge signal is illustrated in FIG. 2, part E, using the same time base scale as employed in FIG. 2, both part A and part C, and is shown as an impulse signal. The frequency spectrum of this discharge signal, as illustrated in FIG. 2, part F, is essentially uniform in height over the frequency bandwidth corresponding to the frequency range illustrated in FIG. 2, parts B and D.

As can be readily observed in FIG. 2, the discharge waveform shapes, resulting from the corona discharges, and their corresponding frequency spectra are individually and uniquely identifiable. Since each corona discharge from a given repeater or equalizer component will generate a discharge signal having the same shape as its associated signature waveform, a source of corona discharge within a repeater or equalizer can be unambiguously determined by examining either the discharge signal shape at the repeater terminals or the shape of its corresponding spectrum.

As will be described in detail hereinafter, a discharge detector locates the source of a corona discharge in a repeater or equalizer under test by comparing the signal energy of the discharge signal at two distinct frequencies. In particular, the discharge signal at the repeater or equalizer terminal is passed through two 48 kHz bandpass filters centered respectively at 30 kHz and 400 kHz. The output of each bandpass filter is then representative of the signal energy of the discharge signal in the passband of the filter. A determination of the corona discharge spectrum shape can be made based on the relationship between these signal energies, and the source of the discharge thus determined.

With reference to FIG. 2, parts B, D and F, and for the typical network component values enumerated hereinabove, it can be readily shown (and will be seen in the figure) that peak energy output of the bandpass filter at 30 kHz will be approximately four times as great as the peak energy output of the bandpass filter at 400 kHz when the discharge signal is generated in response to a bellyband capacitor corona discharge. Additionally, the peak energy output of the 400 kHz bandpass filter will be approximately four times as great as the peak energy output from the 30 kHz bandpass filter for a discharge signal generated in response to a high voltage coupling capacitor corona discharge. Since the frequency spectrum of a coaxial cable area discharge is essentially flat over the entire bandwidth of interest, the peak energy outputs of both bandpass filters will be approximately equal when a corona discharge occurs in the coaxial cable area. Therefore, by comparing the relationship between the peak energy outputs of the bandpass filters centered at 30 kHz and 400 kHz, the source of the corona discharge within the repeater or equalizer under test can be uniquely determined.

Figure 3:
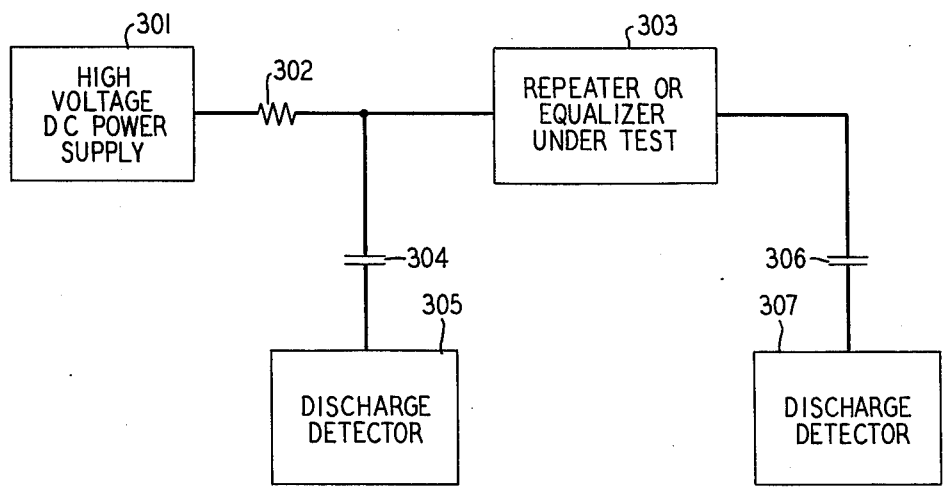
FIG. 3 is a block diagram of the test setup used to identify the source of a corona discharge within a repeater or equalizer.

FIG. 3 illustrates the test setup used for locating the sources of corona discharges within a repeater or equalizer. A power supply 301 couples a high dc voltage through a large decoupling resistor 302 to the coaxial cable terminal input of a repeater or equalizer 303 under test. Power supply 301 supplies a particularly high dc voltage to the network under test to simulate the high voltage conditions the equalizer or repeater will operate under in its undersea environment. A coupling capacitor 304 interconnects the coaxial cable input of the network 303 to a discharge detector 305 and a second coupling capacitor 306 interconnects the output coaxial cable terminal of the network 303 to a second discharge detector 307. Discharge detectors 305 and 307, to be described in detail hereinafter, are identical and automatically record and locate the source of any corona discharge occurring within the network 303 in response to the applied high dc voltage. When a repeater, such as that illustrated in FIG. 1, is being tested by the apparatus of FIG. 3, discharge detector 305 automatically locates and records corona discharges, if any, occurring in the coaxial cable area 111, the high voltage coupling capacitor 103, and the bellyband capacitor 110. Similarly, discharge detector 307 automatically locates and records corona discharges occurring in the coaxial cable area 112, the high voltage coupling capacitor 106, and the bellyband capacitor 110. Thus, when a corona discharge occurs in the bellyband capacitor 110, discharge detectors 305 and 307 both indicate this discharge.

Figure 4:
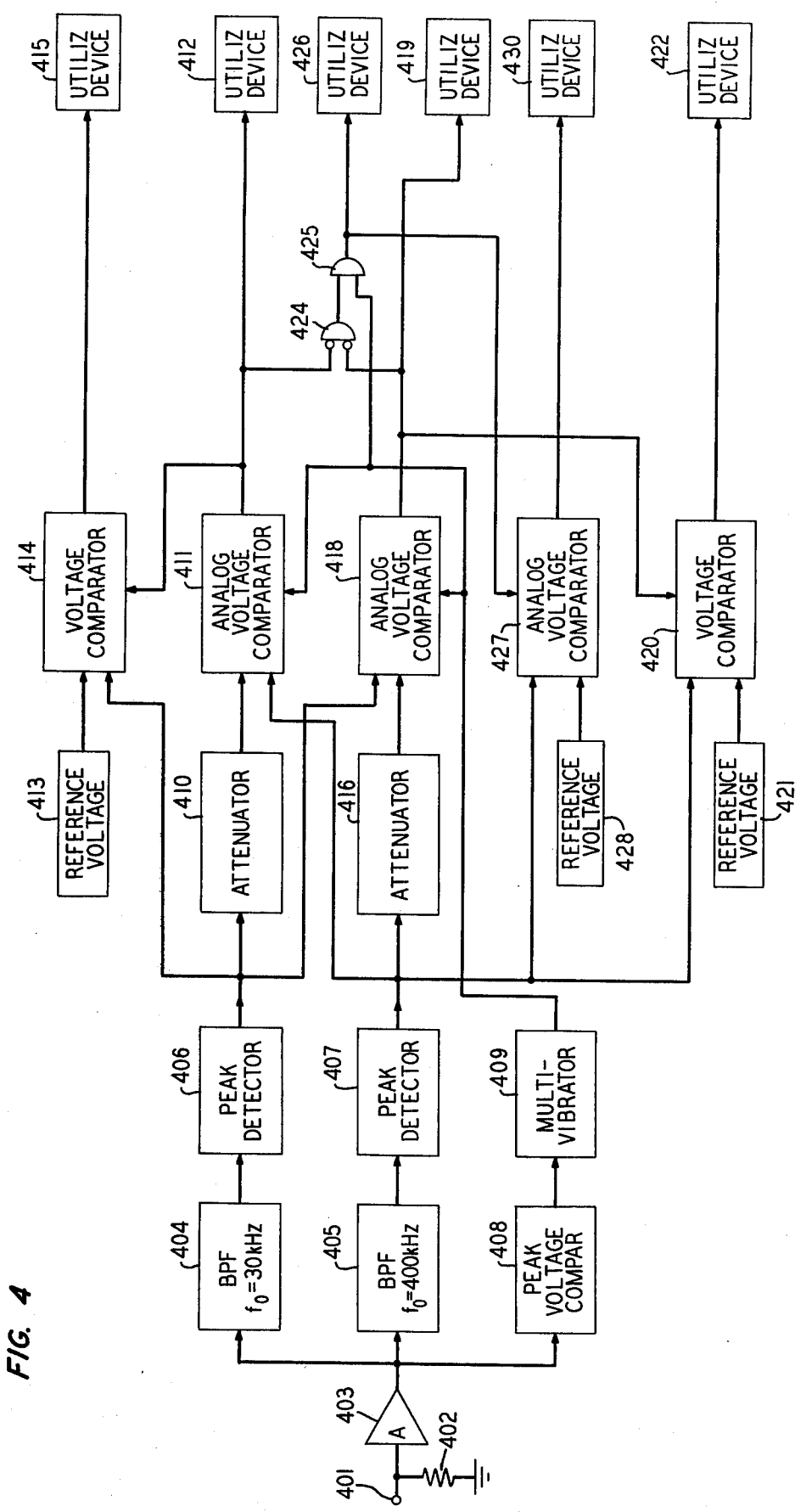
FIG. 4 is a schematic block diagram of the discharge detector employed in the test setup of FIG. 3, and constructed in accordance with the principles of the invention.

FIG. 4 illustrates a block diagram of a corona discharge detector in accordance with the invention which distinguishes the three possible discharge waveform shapes and thus indicates the source of a corona discharge within a repeater or equalizer under test. In addition, the discharge detector of FIG. 4 also determines whether each individual corona discharge within the repeater or equalizer under test would have a deleterious effect upon transmission if it occurred in an in-service environment. Accordingly, as will be described hereinbelow, apparatus is included within the discharge detector for comparing the magnitudes of the discharge signals with three reference voltages, wherein each reference voltage corresponds to a predetermined threshold level for a particular type of discharge.

Since discharge detectors 305 and 307 are identical, only one discharge detector will be described in detail. With reference to FIG. 4, the discharge signal present at the coaxial cable terminal of the repeater or equalizer under test is coupled via input terminal 401 across matching resistor 402 and through amplifier 403. Resistor 402 is used to match the impedance of the coaxial cable system to the discharge detector and, for a 50-ohm cable system, is 50 ohms. The output of amplifier 403 is connected to a 48 kHz bandpass filter 404 having a center frequency of 30 kHz and to a 48 kHz bandpass filter 405 having a center frequency of 400 kHz. The outputs of bandpass filters 404 and 405 are time varying signals having an amplitude dependent upon the energy of the signal applied thereto in the passband of the filter. Bandpass filter 404 is connected to a peak detector 406 and bandpass filter 405 is connected to a peak detector 407. The outputs of peak detectors 406 and 407 are dc voltages equal to the peak signal outputs of bandpass filters 404 and 405, respectively, and thus are representative of the signal energies in the passbands of the filters. By comparing the relative magnitudes of the outputs of peak detectors 406 and 407, one can determine whether the shape of the frequency spectrum of the discharge signal at terminal 401 is that of FIG. 2, part B, part D or part F.

Since signals other than destructive corona discharges can appear at terminal 401, a decision is made, based on the signal magnitude, that a corona discharge has occurred prior to comparing the outputs of peak detectors 406 and 407. The output of amplifier 403 is also connected to a peak voltage comparator 408 for this purpose. Peak voltage comparator 408 compares the peak voltage at the output of amplifier 403 with a reference voltage. If the voltage at the output of amplifier 403 exceeds a threshold voltage, a pulse is produced by peak voltage comparator 408. The threshold chosen by peak voltage comparator 408 is the lowest threshold for the three types of corona discharges to be detected. Accordingly, any signal voltage at the output of amplifier 403 above this threshold will permit a comparison between the outputs of peak detectors 406 and 407. Peak voltage comparator 408 can be of any one of a plurality of known network designs, such as that described in the article "Wideband Partial Discharge Detector" by E. A. Franke and E. Czekaj, *IEEE Transaction on Electrical Insulation,* Vol. EI-10, December 1975.

The output of peak voltage comparator 408 is connected to a multivibrator 409. The delay of multivibrator 409 is chosen such that it exceeds the maximum delay of the bandpass filters 404 and 405. The output of multivibrator 409 is energized in response to the pulse output of peak voltage comparator 408 only after peak detectors 406 and 407 have reached their peak voltage outputs. Once having reached their peak voltages, the outputs of peak detectors 406 and 407 may be compared.

As aforenoted in the analysis of the signature waveforms, a bellyband corona discharge will generate a discharge signal having a frequency spectrum in which the energy at 30 kHz is four times greater than the energy at 400 kHz. A bellyband capacitor corona discharge will be thus indicated when the voltage output of peak detector 406 is significantly greater than the voltage output of peak detector 407. A coupling capacitor discharge will be similarly indicated when the voltage output of peak detector 407 is significantly greater than the voltage output of peak detector 406.

Since the relative magnitude difference between the voltage outputs of peak detectors 406 and 407 will thus normally be approximately four-to-one for either a bellyband capacitor discharge or a coupling capacitor discharge, a cable area corona discharge will be indicated when the relative magnitudes of the outputs of detectors 406 and 407 are less than two-to-one. The output of peak detector 406 is connected to an attenuator 410 which divides the voltage magnitude at the output of peak detector 406 by a factor of two. The output of attenuator 410 is connected to an input of an analog voltage comparator 411. Analog voltage comparator 411 and the analog voltage comparators referred to hereinafter, are state of the art circuits well known to one skilled in the art. The output of peak detector 407 is also connected to an input of analog voltage comparator 411. In addition, the output of multivibrator 409 is connected to a strobe input of comparator 411. Comparator 411 compares the voltages at the output of attenuator 410 and the output of detector 407 when the output of multivibrator 409 is energized. Comparator 411 generates an energized output only when the voltage at the output of attenuator 410 is greater than the voltage at the output of detector 407. Accordingly, the output of comparator 411 is energized when the output of detector 406 is at least twice as great as the output of detector 407. This indicates that the energy of the discharge signal at 30 kHz is greater than the energy at 400 kHz. The energized output of comparator 411 thus indicates that the frequency spectrum of the discharge signal is that of FIG. 2, part B, and that the corona discharge has occurred in the bellyband capacitor. The output of voltage comparator 411 is connected to a utilization device 412, such as a printer, which records the occurrence of a corona discharge in the bellyband capacitor.

The output of peak detector 406 is also connected to an input of a voltage comparator 414. A source of reference voltage 413 is connected to a second input of comparator 414. The output of voltage comparator 411 is connected to comparator 414 to strobe (or enable) a comparison between the applied input voltages. Reference voltage 413 is chosen such that a deleterious bellyband capcacitor corona discharge will produce a voltage output from peak detector 406 greater than this reference voltage. When the output of voltage comparator 411 is energized, indicating a bellyband capacitor corona discharge, voltage comparator 414 is strobed and a comparison is made between the input signals. If the output of detector 406 exceeds the predetermined reference voltage 413, the output of comparator 414 is energized and a utilization device 415 records the event.

A coupling capacitor corona discharge is similarly detected by parallel apparatus. The output of peak detector 407 is connected to an attenuator 416 which divides the magnitude of the voltage output of detector 407 by a factor of two. The output of attenuator 416 is connected to an input of an analog voltage comparator 418. The output of detector 406 is connected to a second input of comparator 418. The output of multivibrator 409 is connected to a strobe or enabling input of comparator 418. Upon being strobed by an energized output from multivibrator 409, comparator 418 compares the output of attenuator 416 with the output of detector 406. When the output of attenuator 416 exceeds the output of detector 406, the output of comparator 418 is energized, indicating a corona discharge in the coupling capacitor. The output of comparator 418 is connected to a utilization device 419, such as a printer, which records this event.

The output of detector 407 is also connected to an input of a voltage comparator 420. A source of reference voltage 421 is connected to a second input of comparator 420. The output of comparator 418 is connected to a strobe input of the voltage comparator 420. Reference voltage 421 is chosen such that a voltage output of peak detector 407 greater than this reference voltage will be indicative of a deleterious coupling capacitor corona discharge. Accordingly, when the output of voltage comparator 418 is energized, a comparison is made between the output of detector 407 and reference voltage 421. If the output of detector 407 exceeds reference voltage 421, the output of voltage comparator 420 is energized and this event is recorded by a utilization device 422.

When a discharge is indicated by peak voltage comparator 408 and neither a bellyband nor coupling capacitor discharge is indicated by comparator 411 or 418, then a corona discharge in the cable area is indicated. The output of comparator 411 is connected to a negate input of a negated AND gate 424 and the output of comparator 418 is connected to a second negated input of gate 424. The output of gate 424 is energized as long as the outputs of both comparators 411 and 418 remain deenergized. The output of gate 424 is connected to a first input of an AND gate 425 and the output of multivibrator 409 is connected to a second input of AND gate 425. When the outputs of comparators 411 or 418 are deenergized with the occurrence of an energized output from multivibrator 409, AND gate 425 is enabled. The output of AND gate 425 is connected to a utilization device 426 which records the occurrence of a discharge in the cable area.

The output of AND gate 425 is connected to a comparator 427. The output of peak detector 407 (or 406) is connected to a first input of comparator 427 and a source of reference voltage 428 is connected to a second input of comparator 427. Reference voltage 428 is chosen such that a deleterious discharge in the cable area will generate a voltage output of detector 407 greater than the reference voltage. When the output of AND gate 425 is energized, a comparison between the output of detector 407 and reference voltage 428 is made and, if the output of detector 407 exceeds the reference voltage 428, the output of comparator 427 is energized, an event which is recorded by utilization device 430.

The above arrangement is illustrative of the application and the principles of the invention. Other embodiments may be devised by those skilled in the art without departing from the spirit and scope thereof.

What is claimed is:

1. A discharge detector for apparatus subject to discharges from a plurality of particular sources within said apparatus, a plurality of signature waveforms having uniquely identifiable time dependent shapes and associated frequency spectrum shapes being predetermined, each of said particular sources generating upon discharge a discharge signal being uniquely identifiable in the time and frequency domains as one of said signature waveforms comprising means for measuring the spectral energies of a discharge signal at two or more predetermined frequencies, means for comparing the magnitudes of said spectral energies at said predetermined frequencies, and means for determining from the relationship between the magnitudes of the spectral energies at said predetermined frequencies the signature waveform in the frequency domain to which said discharge signal is identified and for determining the source of said discharge from said identified signature waveform.

2. A discharge detector as defined in claim 1 further comprising means for determining whether the magnitude of a discharge exceeds a predetermined threshold.

3. A discharge detector as defined in claim 1 wherein the means for measuring includes a plurality of bandpass filters, each of said bandpass filters having a center frequency at a respective one of said predetermined frequencies.

4. A discharge detector as defined in claim 3 wherein the comparing means includes a plurality of voltage comparators to compare the peak voltage outputs of said bandpass filters.

5. A discharge detector as defined in claim 4 further comprising means for determining whether the magnitude of a discharge exceeds a predetermined threshold.

6. A method for detecting the source of a discharge in apparatus subject to discharges from a plurality of particular sources within said apparatus comprising the steps of:

inducing a discharge from each of said particular sources of discharge within said apparatus;

determining the unique signature waveform associated with each of said sources of discharge;

applying a test voltage to said apparatus;

comparing the shape of a discharge signal generated in response to said test voltage with the shapes of said signature waveforms; and determining the source of said discharge by identifying the discharge signal with a signature waveform it most closely resembles and the particular source associated with the identified signature waveform.

7. A method for detecting the source of a discharge in apparatus subject to discharges from a plurality of particular sources within said apparatus comprising the steps of:

inducing a discharge from each of said particular sources of discharge within said apparatus;

determining the unique time dependent signature waveform associated with each of said particular sources of discharge;

determining the shape of the frequency spectrum of each of said signature waveforms;

applying a test voltage to said apparatus;

comparing at two or more predetermined frequencies the spectral energies of the discharge signal generated in response to said test voltage;

identifying the shape of the frequency spectrum of the signature waveform which the frequency spectrum of the discharge signal most closely resembles from the relationship between the spectral energies of said discharge signal at said predetermined frequencies; and determining the source of said discharge from the identified signature waveform.

* * * * *